(12) United States Patent
Le Neel et al.

(10) Patent No.: US 7,645,660 B2
(45) Date of Patent: Jan. 12, 2010

(54) METHOD FOR MANUFACTURING HIGH-STABILITY RESISTORS, SUCH AS HIGH OHMIC POLY RESISTORS, INTEGRATED ON A SEMICONDUCTOR SUBSTRATE

(75) Inventors: Olivier Le Neel, Irving, TX (US);
Olivier Girard, Saint Egreve (FR);
Fabio Ferrari, Irving, TX (US)

(73) Assignees: STMicroelectronics, Inc., Carrollton, TX (US); STMicroelectronics SA (FR)

( * ) Notice: Subject to any disclaimer, the term of this patent is extended or adjusted under 35 U.S.C. 154(b) by 432 days.

(21) Appl. No.: 11/314,194

(22) Filed: Dec. 21, 2005

(65) Prior Publication Data

US 2007/0141848 A1    Jun. 21, 2007

(51) Int. Cl.
*H01L 21/8238* (2006.01)
(52) U.S. Cl. ................ 438/210; 438/717; 257/E21.035
(58) Field of Classification Search ............... 438/142, 438/167, 171, 190, 210, 238, 329, 330, 717; 257/E21.035
See application file for complete search history.

(56) References Cited

U.S. PATENT DOCUMENTS

| 5,187,122 | A  | * | 2/1993 | Bonis ........................... 438/238 |
| 5,656,524 | A  | * | 8/1997 | Eklund et al. ................ 438/238 |
| 6,797,554 | B2 | * | 9/2004 | Katayama .................... 438/210 |
| 7,338,852 | B2 | * | 3/2008 | Hsu ............................. 438/238 |

* cited by examiner

*Primary Examiner*—Khiem D Nguyen
(74) *Attorney, Agent, or Firm*—David V. Carlson; Lisa K. Jorgenson

(57) ABSTRACT

A method for protecting a circuit component on a semiconductor substrate from a plasma etching or other removal process includes forming a screening layer over an auxiliary layer to conceal at least an area of the auxiliary layer that overlays at least a portion of the circuit component, such as for example a high-ohmic poly resistor. The method transfers a pattern defined by a mask onto the screening layer by selectively removing portions of the screening layer in accordance with the pattern. Portions of the auxiliary layer that are not protected by the screening layer are removed using a plasma gas selective to the auxiliary layer material, without removing the area of the auxiliary layer that overlays the portion of the circuit component, thereby protecting the circuit component from the plasma gas via the screening layer and auxiliary layer.

20 Claims, 7 Drawing Sheets

METHOD FOR MANUFACTURING HIGH-STABILITY RESISTORS, SUCH AS HIGH OHMIC POLY RESISTORS, INTEGRATED ON A SEMICONDUCTOR SUBSTRATE

TECHNICAL FIELD

This disclosure generally relates to the field of manufacturing microelectronic components integrated on a semiconductor substrate, and more particularly but not exclusively to a method for manufacturing high-stability analog resistors on an integrated circuit.

BACKGROUND INFORMATION

One of the basic technological goals when manufacturing analog resistors is to achieve a low dispersion or high stability control of the resistances across the analog resistors from die-to-die, wafer-to-wafer, and lot-to-lot.

Current methods to improve the cross-chip stability of analog resistors employ laser blowing, Zener diode "zapping", or other techniques that generate a desired resistance. Such methods involve manufacturing resistor chains across a substantially large area of silicon and trimming the resistor chain to the desired resistance. The method of laser blowing creates open circuits in the resistor chain, while the Zener diode method creates short circuits within the resistor chain in order to achieve the desired resistances and thus cross-chip stability.

Such methodologies involve a substantial amount of processing time since they use the specific trimming and testing of each resistor chain across all dies in each wafer of every lot. The resistor chains also cover a large area of the silicon wafer, leading to a costly manufacturing process. For example, many of the resistors in the chain are not pertinent to the overall resistance, since most of the resistors are electrically disconnected using the various trimming techniques such as laser "blowing" or zener "zapping" as described above, and therefore significant areas of the wafer may ultimately be wasted.

BRIEF SUMMARY OF THE INVENTION

An embodiment comprising protecting a circuit component on a semiconductor substrate from a plasma etching or removal process, the method comprising: forming a screening layer over an auxiliary layer to cover at least an area of the auxiliary layer that overlays at least a portion of the circuit component; transferring a pattern defined by a mask onto the screening layer by selectively removing portions of the screening layer in accordance with the pattern; and removing portions of the auxiliary layer that are not protected by the screening layer, using a plasma gas selective to the auxiliary layer material, without removing the area of the auxiliary layer that overlays the portion of the circuit component, thereby protecting the circuit component from the plasma gas via the screening layer and auxiliary layer.

Another embodiment comprising protecting a circuit component on a semiconductor substrate from a plasma etching or removal process, the method comprising: forming a second layer over a first layer to cover at least an area of the first layer that overlays at least a portion of the circuit component; transferring a pattern defined by a mask onto the second layer by selectively removing portions of the second layer in accordance with the pattern; and removing portions of the first layer that are not protected by the second layer, using a plasma gas selective to the first layer material, without removing the area of the first layer that overlays the portion of the circuit component, thereby protecting the circuit component from the plasma gas via the second layer and first layer.

Another embodiment comprising protecting a circuit component on a semiconductor substrate from a plasma etching or removal process, the system comprising: a screening layer overlaying an auxiliary layer that covers at least a portion of the circuit component, wherein the screening layer protects the circuit component from the plasma etching or removal process, thereby preventing fluctuations in electrical characteristics of the circuit component; and a mask to transfer a defined pattern onto the screening layer by selectively removing portions of the screening layer in accordance with the defined pattern.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION

Figure 1:
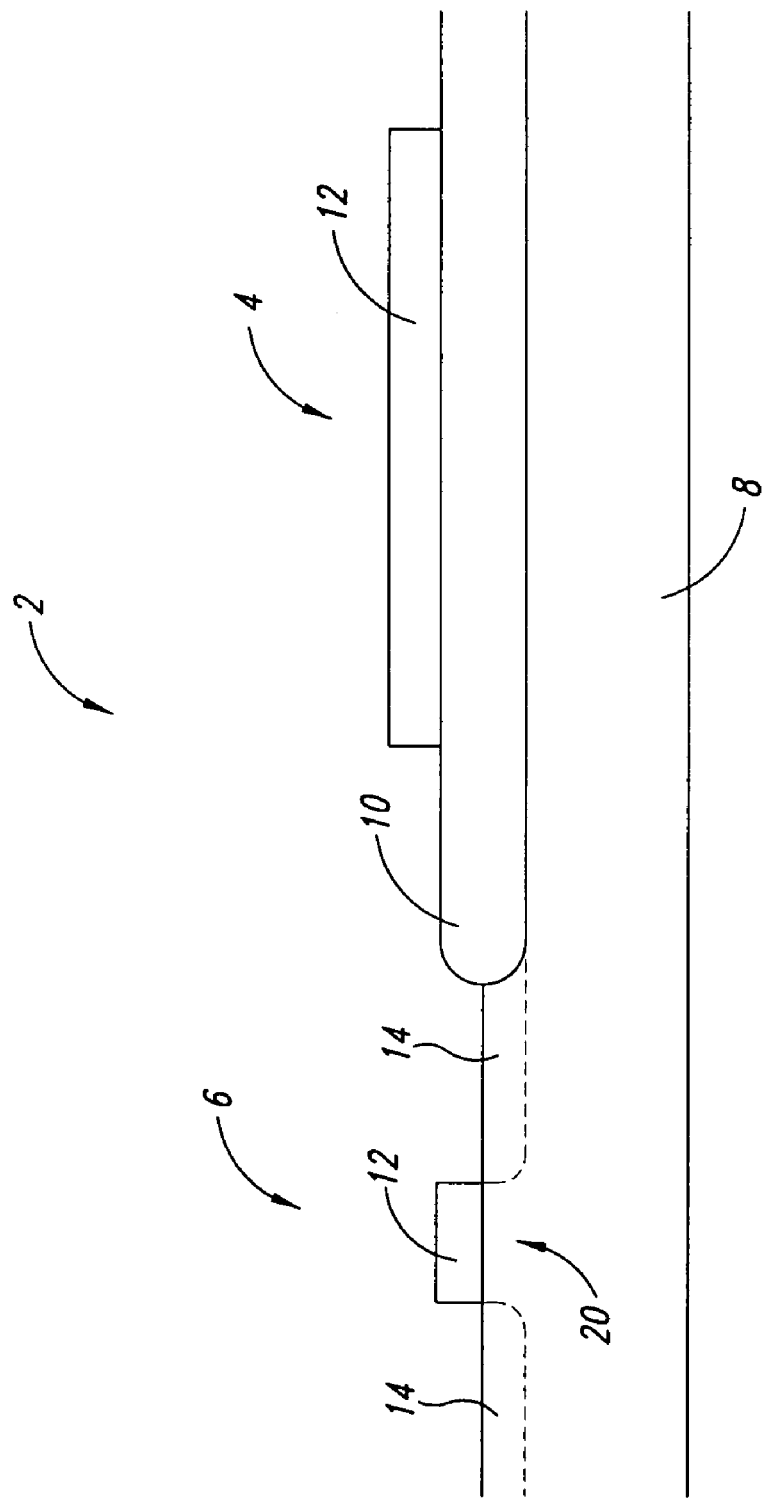
FIG. 1 is a cross-section of a portion of an integrated circuit during manufacturing, depicted prior to deposition of an auxiliary layer, according to one illustrated embodiment.

Embodiments of a method for manufacturing components and circuit structures, such as analog resistor components integrated on a semiconductor substrate are described herein. In the following description, numerous specific details are given to provide a thorough understanding of embodiments of the invention. One skilled in the relevant art will recognize, however, that the embodiments can be practiced without one or more of the specific details, or with other methods, components, materials, etc. In other instances, well-known structures, materials, or operations are not shown or described in detail to avoid obscuring various aspects.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Furthermore, the particular features, structures, or characteristics may be combined in any suitable manner in one or more embodiments.

The process steps hereinafter described are not exhaustive of an integrated circuit manufacturing process. Embodiments can be implemented along with other integrated circuit manufacturing techniques, and only those steps necessary for an understanding of the embodiments will be described.

Throughout the specification and claims, the term "component" or "components" refer to microelectronic devices on an integrated circuit during various stages of fabrication. Furthermore, the term "microelectronic component" or "microelectronic components" refer to components that are not susceptible to substantial variances in their electrical characteristics due to a spacer etch or removal process. Such "microelectronic components" may be for example: CMOS transistors, MOS transistors, diodes, capacitors, or other similar components.

Throughout the specification and figures the "microelectronic component" may be referred to and illustrated as a CMOS transistor. It will be noted that this is for illustrative purposes only and is not be construed as limiting the scope of the embodiments and appended claims.

Throughout the specification and claims the term "circuit component" or "circuit components" refer to components that are susceptible to substantial variances in their electrical characteristics due to a spacer etch or removal process or other factor. Such "circuit components" may be for example high ohmic polysilicon resistors, metal resistors, active area resistors, or any other similar component.

Throughout the specification and figures the "circuit component" may be referred to and illustrated as a high-ohmic poly resistor or poly resistor. This is for illustrative purposes only and is not to be construed as limiting the scope of the embodiments and appended claims.

The cross-sectional views of portions of an integrated circuit while being manufactured have not been drawn to scale but so as to emphasize major features of the embodiments.

As an overview, it is desirable to employ a manufacturing process that will ensure cross-chip stability of resistors without having to trim each resistor chain accordingly to reach a desired resistance and without the need to test each of the trimmed resistors.

An embodiment further provides protection to circuit components that are susceptible to plasma damage wherein the plasma damage is due to an etching or other removal step during a manufacturing process. According to one embodiment, a film used for the formation of sidewall spacers is formed as a layer over all components present on a first layer, such as a semiconductor substrate. A photosensitive layer, such as photoresist, is then deposited over the film layer used to form sidewall spacers. The photosensitive layer is exposed to UV (ultraviolet) light through a mask that effectively defines the areas of photosensitive material, such as the photoresist, to be removed. The mask comprises specific patterns of transparent and opaque regions that define the portions of area underlying the mask that will be exposed and not exposed to UV light.

According to one embodiment, portions of the photosensitive layer exposed to the UV light become soluble and are washed away using a developer solution. The non-exposed portions of the photosensitive layer remain intact to protect the underlying film layer from the etching process, such as for example a plasma etch, which follows the photolithographic removal step described above. The etchant such as chlorine (Cl) or fluorine (F), which is used in the plasma gas for the removal of the film layer, is selective to the material comprising the film layer and substantially non-selective towards the photosensitive material, thereby allowing for the non-exposed photosensitive material to serve as a substantial barrier to the etching or otherwise removal process step.

The film layer alone may not be a sufficient barrier to the etching or removal step because an overetch into the component or circuit element underlying the film layer may occur, thereby degrading the electrical characteristics of the component. Therefore, an embodiment forms the photosensitive layer over the film layer to protect the underlying circuit component from the etching or removal step.

Upon the completion of the etching process (e.g., plasma etch), portions of the photosensitive layer that were not exposed to UV light are removed, resulting in the film layer material covering circuit components that would otherwise have been damaged during the etching process (such as plasma etch).

FIG. 1 shows a cross-section of a portion of an integrated circuit 2 during manufacturing, depicted prior to deposition of an auxiliary layer 16, according to one embodiment.

In the illustrated embodiment the cross-section portion of the integrated circuit 2 comprises at least one circuit component 4 (such as a resistor) and at least one microelectronic component 6 (such as a transistor), which are both present on an underlying substrate 8. The substrate 8 is the underlying material that supports the integrated circuit components 4, 6 and may be of silicon material or other suitable material. Areas of electrical isolation, such as for example field oxide 10, provide electrical isolation between components on the substrate 8. Field oxide 10 may be formed on the substrate 8 using suitable process techniques known in the art.

The circuit component 4 is illustrated as a polysilicon resistor, such as a high ohmic polysilicon resistor (HIPO), but is not limited to such a resistor type. The circuit component 4 may be for example, but not limited to, a metal or active area resistor or other type of resistor. The microelectronic component 6 is illustrated as a Metal Oxide Semiconductor (MOS) transistor but is not limited to such a component. The microelectronic component 6 may be for example, but not limited to, a diode or a capacitor or other type of component.

In the illustrated embodiment, a polysilicon layer 12 may serve as a gate electrode for the microelectronic component 6 and as resistive material for the circuit component 4. The circuit component 4 and/or the microelectronic component 6 may further comprise an active area 14. The active area 14 is a portion of the substrate 8 that does not provide electrical isolation (e.g., field oxide) and may or may not be doped with dopants such as impurity atoms that are mixed into the material crystal comprising the substrate 8 (e.g., silicon crystal). The dopants have either a free electron or hole, hence the dopants may be n-type (free electron) or p-type (free hole) thereby providing conducting capabilities to the substrate 8.

Figure 2:
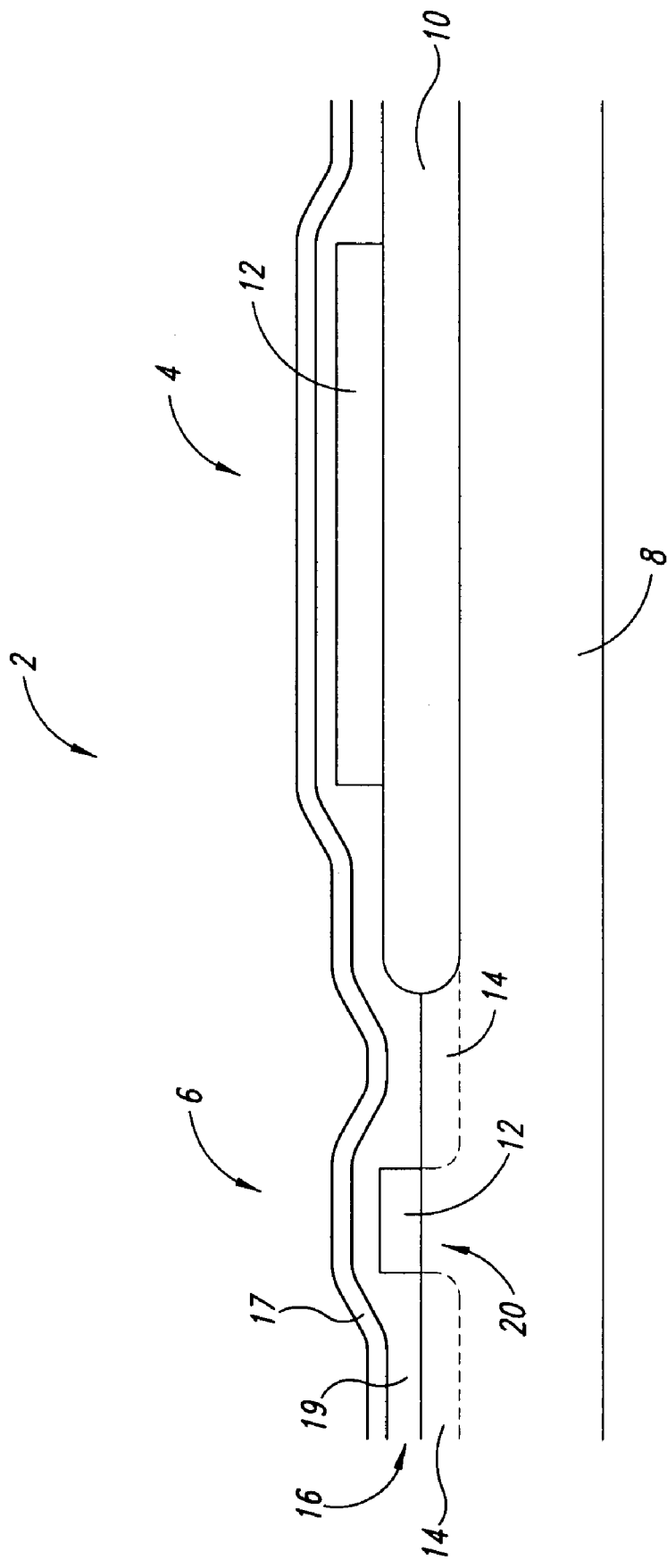
FIG. 2 is a cross-section of a portion of an integrated circuit during manufacturing, depicted after deposition of the auxiliary layer, according to one illustrated embodiment.

FIG. 2 shows a cross-section of a portion of the integrated circuit 2 during manufacturing, depicted after deposition of an auxiliary layer 16, according to one embodiment.

The auxiliary layer 16 may be a blanket deposition overlaying components 4, 6 on the integrated circuit 2 to provide a layer of spacer material that can be selectively etched or otherwise removed to form sidewall spacers 18 (shown in FIGS. 5 and 6) adjacent to the polysilicon layers 12 that serve as a gate for the microelectronic component 6. Sidewall spacers 18 allow for the formation of lightly doped regions adjacent each side of a transistor channel 20 to reduce "hot carrier effects" that degrade the performance of the microelectronic component 6 (e.g., transistor). The term "hot carrier effects" refers to either holes or electrons that have gained very high kinetic energy after being accelerated by a strong electric field in areas of high field intensities within the microelectronic component 6 (e.g., a MOS transistor). The "hot carriers" can become injected and trapped in areas of the microelectronic component 6 where they should not be, forming a space charge that causes the microelectronic component 6 to degrade or become unstable. The lightly doped regions (not shown) reduce the electric field within the channel 20 by increasing the resistance near the active area diffusions 14.

The auxiliary layer 16 of FIG. 2 may be formed through a deposition of a tetraethylorthosilicate oxide (TEOS) layer 19, which is the material used for the sidewall spacers 18 or other suitable material. The deposition may be in the form of a low-pressure vapor deposition (LPVD) or any suitable deposition technique. The TEOS layer 19 may protect underlying components on the integrated circuit 2.

According to one embodiment, a layer 17 of silicon nitride (SiN) may be deposited over the TEOS layer 19 using a method that is similar to the TEOS deposition. The SiN layer 17 mainly serves as a substantial barrier to hydrogen diffusion and is an additional protection to the underlying components on the integrated circuit 2.

Figure 3A:
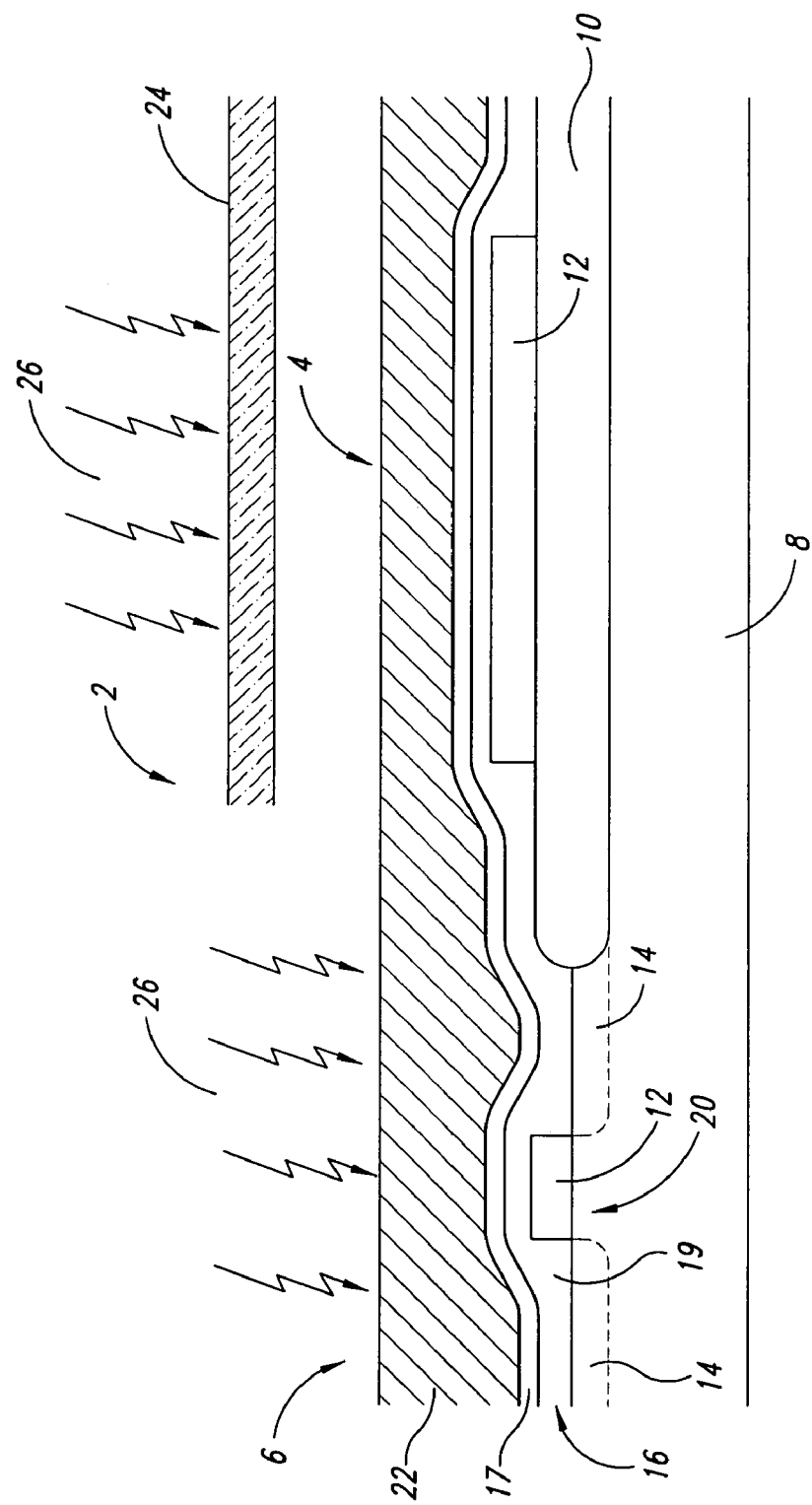
FIGS. 3A-3B are cross-sections of a portion of an integrated circuit depicted through successive steps of photolithography, according to one illustrated embodiment.
Figure 3B:
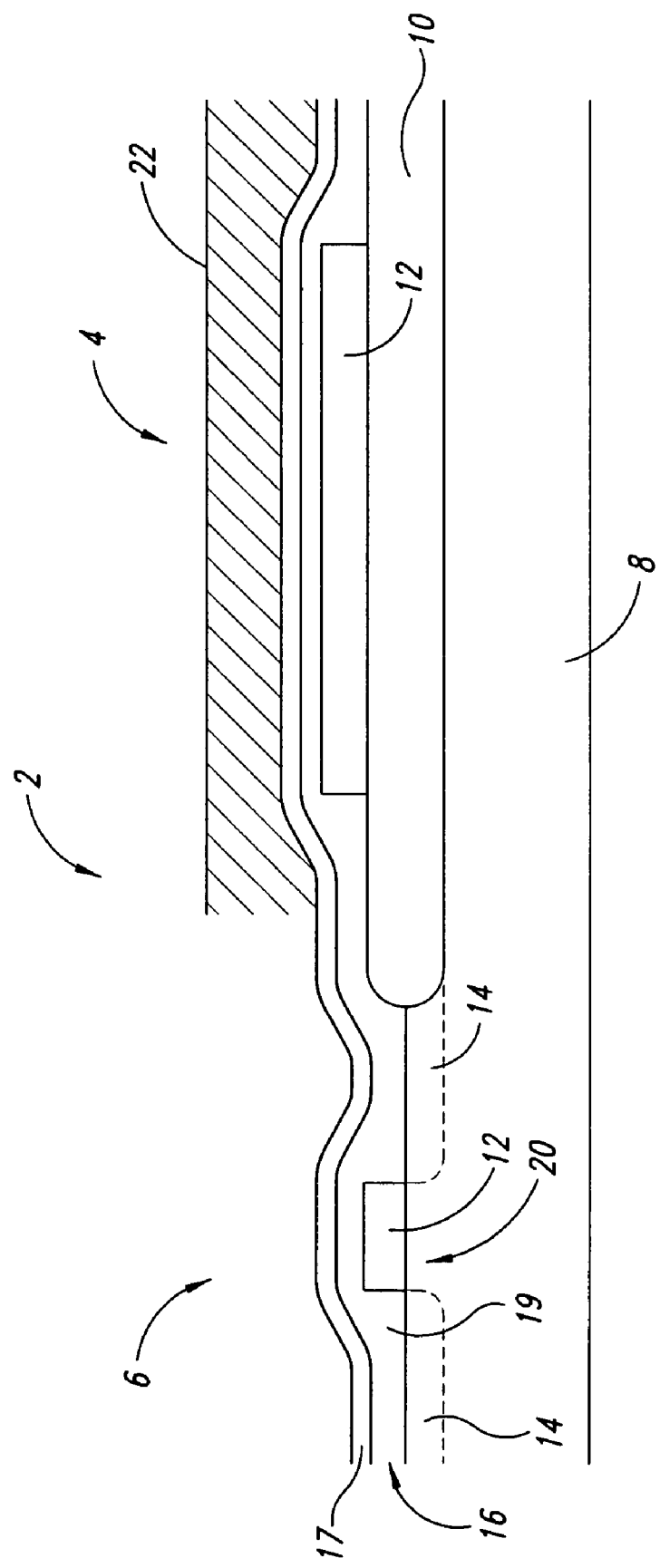

FIGS. 3A-3B show cross-sections of a portion of the integrated circuit 2 depicted through successive steps of photolithography, according to one embodiment.

Photolithography is the process of transferring geometric shapes on a mask 24 to an underlying semiconductor surface. A screening layer 22 is deposited overlaying the auxiliary layer 16. The screening layer 22 may be a photosensitive material (e.g., photoresist) that is selectively removable through suitable photolithographic techniques. High-speed centrifugal whirling of silicon wafers is one example of a method for applying photoresist coatings in Integrated Circuit (IC) manufacturing. This technique, known as "Spin Coating," produces a thin uniform layer of photoresist on the auxiliary layer 16.

The screening layer 22, such as for example photoresist layer, may be either positive or negative. For positive resists (as illustrated in FIGS. 3A-3B), the screening layer 22 is exposed to an ultraviolet (UV) light 26 wherever the underlying material is to be removed. Exposure to the UV light 26 changes the chemical structure of the screening layer 22 material so that it becomes more soluble in a developer solution. The exposed screening layer 22 is then washed away by the developer solution, leaving windows of the bare underlying material (e.g., auxiliary layer 16). When using the screening layer 22 that is made from material comprising for example positive photoresist, the mask 24 contains an exact copy of the desired pattern that is intended to remain on the underlying auxiliary layer 16. Thus in FIG. 3B, the portion of the screening layer 22 covered by the mask 24 remains intact over the circuit component 4 (e.g., polysilicon resistor), while the unmasked portion of the screening layer 22 over the microelectronic component 6 (e.g., transistor) is exposed for removal.

Screening layers that are made from material comprising for example negative photoresist layers (not shown) behave in a manner opposite to that of the screening layers 22 comprising positive photoresist material. Exposure to the UV light 26 causes the negative photoresist to become polymerized, therefore more difficult to dissolve in the developer solution. The negative photoresist remains on the surface wherever it is exposed to the UV light 26 and the developer solution removes only the unexposed portions of the negative photoresist. Masks used for negative photoresists, therefore, contain the inverse (or photographic "negative") of the pattern to be transferred.

Figure 4:
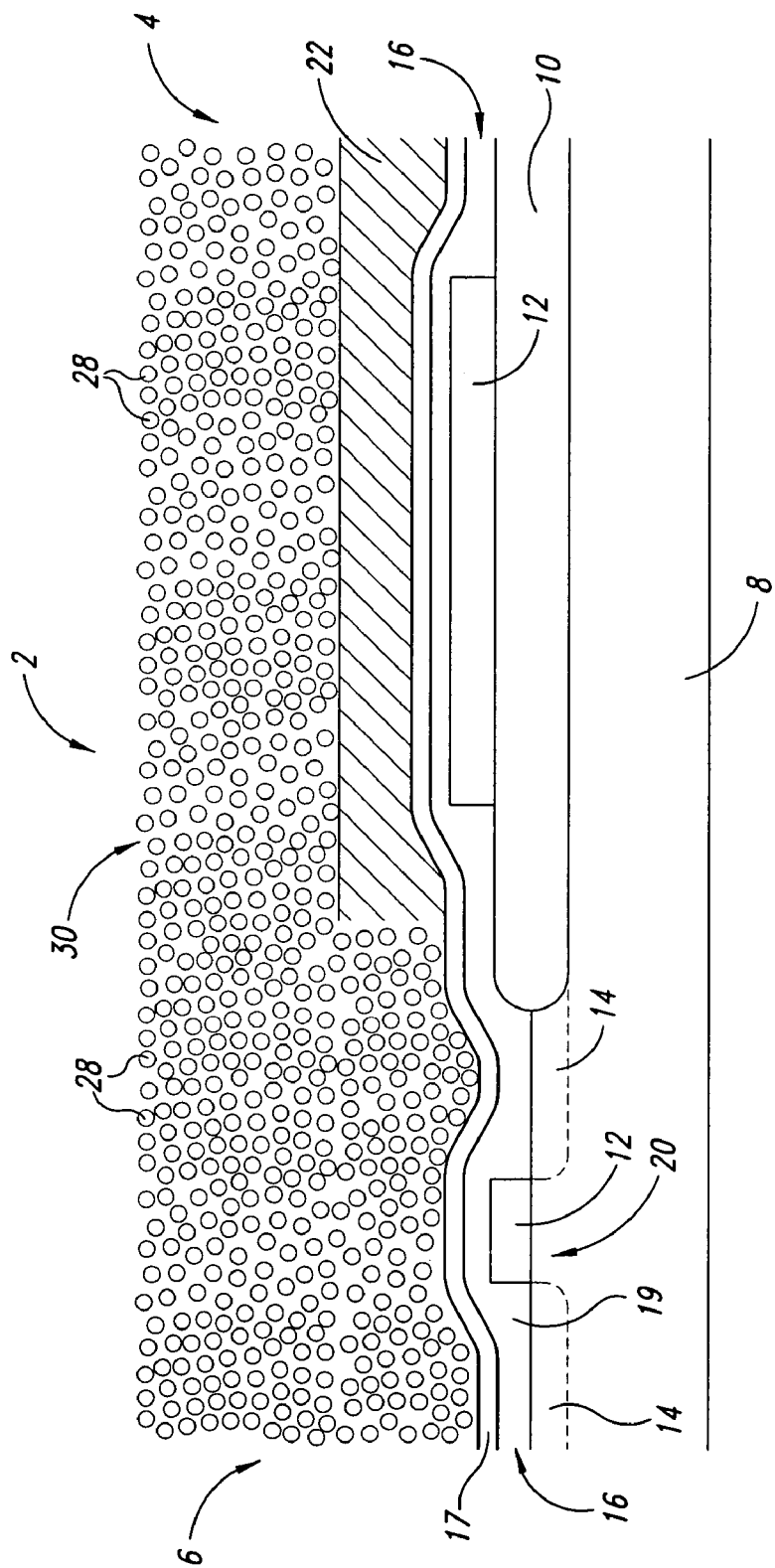
FIGS. 4-5 are cross-sections of a portion of an integrated circuit throughout an etching or other removal process, according to one embodiment.
Figure 5:
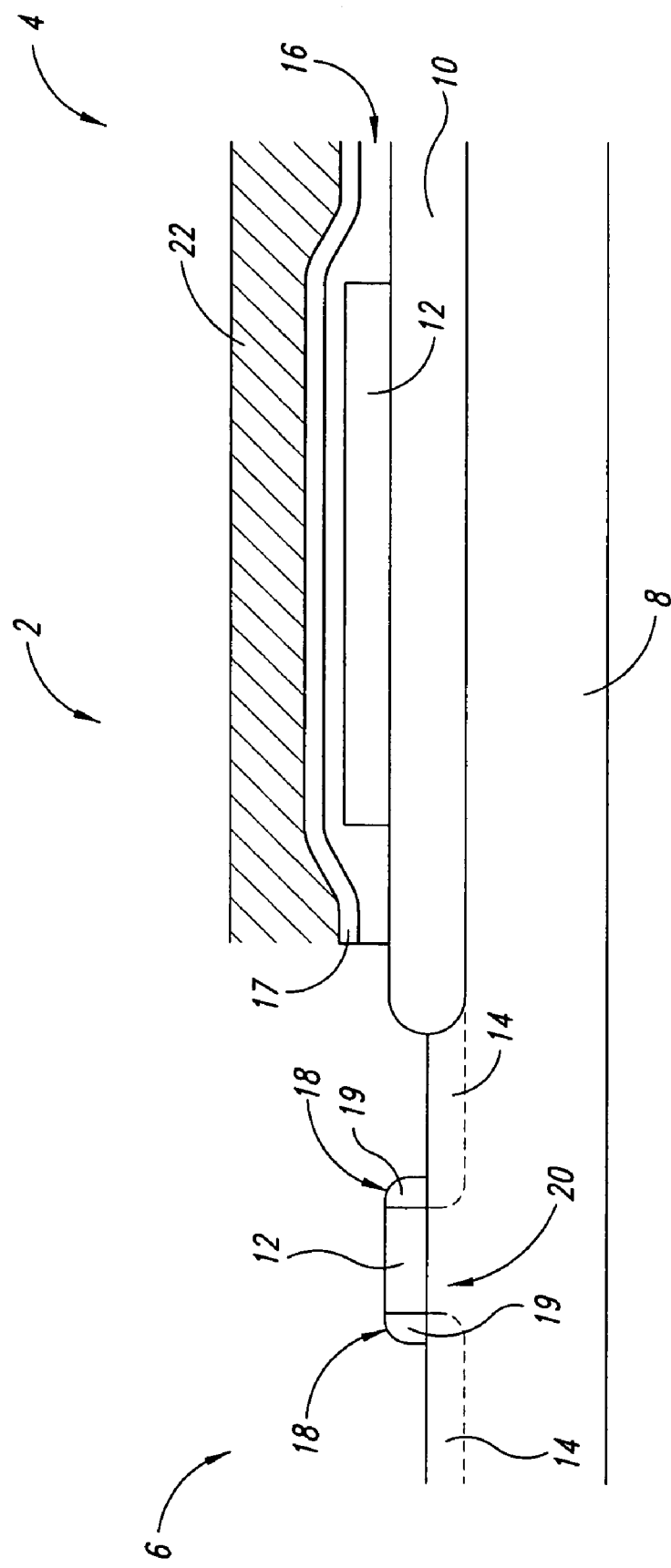

FIGS. 4-5 show cross-sections of the portion of the integrated circuit 2 throughout an etching or other removal process, according to one embodiment.

Figure 6:
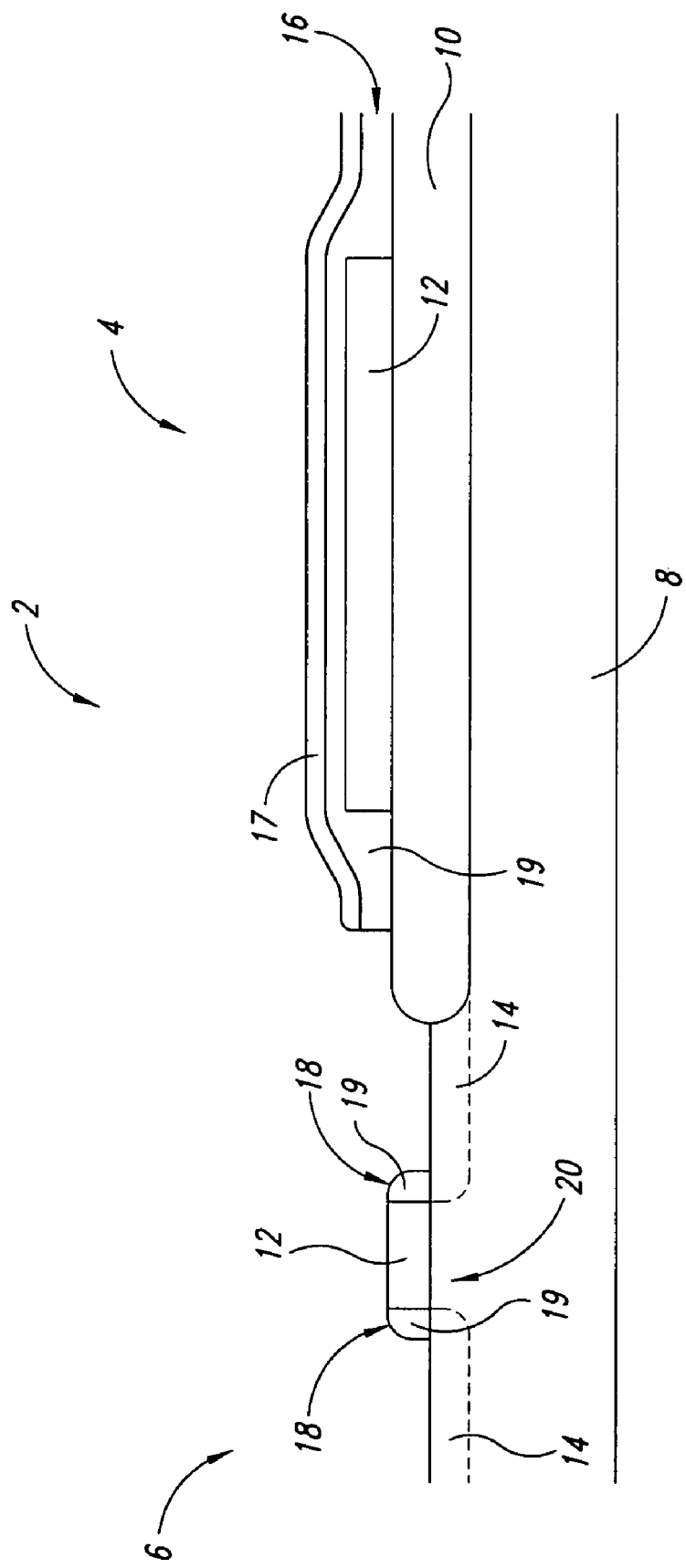
FIG. 6 is a cross-section of a portion of an integrated circuit following a removal of a remaining screening layer, according to an embodiment.

An etching material 30 used in the etching or removal process, which follows the selective removal of a portion of the screening layer 22 that has been exposed to UV light, may be a plasma etching material. The etching material 30 may be used to selectively etch or remove the auxiliary layer 16 to form sidewall spacers 18 (as shown in FIGS. 5 and 6) adjacent to the polysilicon layer 12. During the etching process, the remaining screening layer 22 (the portion that was not exposed to the UV light) over the component 4 serves as a barrier to the etching material 30 (e.g., plasma material), resulting in only selected portions of the auxiliary layer 16 (not covered by the screening layer 22) being removed or etched over the component 6. The remaining screening layer 22 prevents the etching material 30 (e.g., plasma etching material) from selectively etching away the other portions of the auxiliary layer 16 and from contacting the underlying components, such as the circuit component 4. For example, FIG. 5 shows the end result of the selective etching (e.g., plasma etching) or removal of the auxiliary layer 16 covering the microelectronic component 6, thereby forming the sidewall spacers 18.

Plasma etching works on the principle of taking a reagent gas comprising reactive gaseous elements such as for example Chlorine (Cl) or Fluorine (F) 28, and transforming the reagent gas into a plasma gas 30 having etching capabilities. The reactive gaseous elements described above are within the molecular structure of the reagent gas and are activated via a radio frequency (RF) energy source to serve as etchants 28.

The plasma gas 30 is formed by entering the integrated circuit 2 into a chamber and evacuating the air to form a vacuumed chamber, which is pressurized for example at 1 torr. The reagent gas is introduces into the chamber and the RF energy ionizes the gas and forms the etching plasma 30, which reacts with the auxiliary layer 16 to form volatile products that are pumped away.

The electrical discharge within the gas due to the RF energy breaks apart the gas molecules releasing for example fluorine, chlorine, or other reactive gases that comprise the initial molecular structure of the reagent gas. These reactive free atoms or etchants 28 chemically react with the portions of the auxiliary layer 16 that are to be etched or otherwise removed.

Referring to the prior art, in the event that the etching material 30 etches away the auxiliary layer 16 and reaches for example a portion of an underlying polysilicon resistor, the etching is likely to consume a portion of the underlying polysilicon thickness and damage the crystal structure of the polysilicon. Crystal damage to the polysilicon layer may have an adverse affect on the mobility of the polysilicon and consequently vary the resistance of the polysilicon resistor. The etching material 30 may also have adverse affects on the electrical and/or physical characteristics of another underlying component as well, alternatively or in addition to the polysilicon resistor. An embodiment of the invention, such as described herein, addresses these problems by protecting the circuit component 4 during the plasma etching process, using the screening layer 22.

FIG. 6 shows a cross-section of the portion of the integrated circuit 2 following a removal of the remaining screening layer 22, according to an embodiment.

After the etching or otherwise removal of the desired portions of the auxiliary layer 16, the remaining screening layer 22 of FIG. 5 that served to protect the circuit component 4 from etching damage, is removed. The integrated circuit 2 may undergo for example plasma ashing, dry etching, wet etching, or any suitable removing technique to remove the remaining screening layer 22. Plasma ashing entails placing the integrated circuit 2 into a vacuum chamber that is injected with oxygen. RF (Radio Frequency) power is applied to the oxygen within the vacuum chamber, which forms oxygen radicals. The oxygen radicals react with the screening layer 22 to oxidize it to water, carbon monoxide, and carbon dioxide. The ashing step may be used to remove only the outermost layer of the screening layer 22 while an additional dry or wet etching process is used for the remainder of the screening layer 22.

The dry etching process etches or selectively removes the desired screening layer 22 through the use of gases such as chemically reactive gases, as described above, or through physical bombardment of argon atoms into the screening layer 22. Dry etching allows for better control of the removal process and a reduction in contamination levels present on the auxiliary layer 16 underlying the removed screening layer 22.

The wet etching process selectively etches or removes the desired screening layer 22 via submersion of the integrated circuit 2 in a chemical solution bath. The chemical solution comprises etchants (not shown) that are selective towards the screening layer material 22.

Therefore in conclusion, during layout design of the integrated circuit 2, components 4, 6 are designed to achieve desired electrical targets. Such electrical targets are to be fulfilled for each manufactured component 4, 6 throughout production, without extreme variances in the electrical characteristics between identically designed components 4,6 throughout dies, wafers, and lots. According to the prior art, in the event that electrical targets are not satisfied, there may be a need to individually tailor each component 4, 6 that has electrical characteristics outside the target limits.

In the prior art, the polysilicon resistor is designed as a resistor chain structure to allow for the polysilicon resistor to be specifically tailored, even after production, in order to reach the desired electrical target. The polysilicon resistor is designed to meet the electrical targets but is affected by the etching or other removal step such as plasma etching, which degrades the polysilicon layer in unpredictable ways, causing inconsistent electrical characteristics that need to be corrected.

The embodiments discussed above addresses these drawbacks by preventing the plasma gas 30 from contacting the circuit component 4 (e.g., polysilicon resistor). This allows for the circuit component 4 to maintain the electrical targets it was designed to fulfill following production, without the need for individual correction as discussed above. The cost of an additional mask 24, which ultimately provides protection against plasma damage outweighs the cost of individually trimming and then testing each circuit component 4 to fulfill the electrical target requirement.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A method for protecting a circuit component on a semiconductor substrate from a plasma etching or removal process, the method comprising:
    forming an auxiliary layer over the circuit component to completely overlay and surround top and side surfaces of the circuit component;
    forming a screening layer over the auxiliary layer to cover at least an area of the auxiliary layer that completely overlays and surrounds the top and side surfaces of the circuit component;
    transferring a pattern defined by a mask onto the screening layer by selectively removing portions of the screening layer in accordance with the pattern, the remaining portions of the screening layer covering at least the area of the auxiliary layer that overlays the top and side surfaces of the circuit component; and
    removing portions of the auxiliary layer that are not protected by the screening layer, using a plasma gas selective to the auxiliary layer material, without removing the area of the auxiliary layer that completely overlays and surrounds the top and side surfaces of the circuit component, thereby protecting the circuit component from the plasma gas via the screening layer and auxiliary layer.

2. The method of claim 1, further comprising:
    forming the circuit component on a first layer; wherein forming the auxiliary layer includes depositing the auxiliary layer over the circuit component formed on the first layer.

3. The method of claim 2, wherein depositing the auxiliary layer includes depositing a tetraethylorthosilicate oxide (TEOS) layer.

4. The method of claim 2, wherein depositing the auxiliary layer includes depositing a silicon nitride (SiN) layer over the tetraethylorthosilicate oxide (TEOS) layer to further stabilize electrical characteristics of the circuit component by serving as a baffler to hydrogen diffusion.

5. The method of claim 2, wherein depositing the auxiliary layer includes depositing the auxiliary layer via Low Pressure Vapor Deposition (LPVD).

6. The method of claim 1, wherein forming the screening layer includes depositing photosensitive material.

7. The method of claim 1, wherein transferring the pattern defined by the mask onto the screening layer includes using a photolithographic process of exposing the defined pattern of the screening layer to ultraviolet light.

8. The method of claim 1, wherein removing portions of the auxiliary layer includes using the plasma gas that is substantially selective to both SiN (Silicon Nitride) and tetraethylorthosilicate oxide (TEOS).

9. The method of claim 1, further comprising:
    removing the screening layer that protects the circuit component from the plasma gas.

10. The method of claim 9, wherein removing the screening layer includes plasma ashing the screening layer.

11. The method of claim 9, wherein removing the screening layer includes dry etching the screening layer.

12. The method of claim 9, wherein removing the screening layer includes wet etching the screening layer.

13. The method of claim 1, wherein forming the auxiliary layer over the top and side surfaces of the circuit component includes forming the auxiliary layer adjacent side surfaces of the circuit component that extend substantially perpendicular to the top surface.

14. The method of claim 1, wherein the auxiliary layer includes a first portion to completely encapsulate the circuit component between the auxiliary layer and a surface carrying the circuit component and a second portion adjacent the first portion, wherein the pattern defined by the mask protects the first portion of the auxiliary layer from the plasma gas used to selectively remove the second portion of the auxiliary layer.

15. The method of claim 1, further comprising:
forming a poly silicon layer overlying a first layer;
forming the circuit component from the poly silicon layer;
forming a gate electrode from the poly silicon layer adjacent the circuit component; and
forming the auxiliary layer over the gate electrode and the circuit component to overlay the top and side surface of the circuit component.

16. The method of claim 15 wherein the pattern defined by the mask onto the screening layer protects the area of the auxiliary layer that overlays the top and side surfaces of the circuit component and does not protect a second area of the auxiliary layer that overlays the gate electrode.

17. The method of claim 16 wherein removing portions of the auxiliary layer includes removing portions of the second area of the auxiliary layer that overlays the gate electrode, the remaining portions of the second area of the auxiliary layer forming sidewall spacers adjacent the gate electrode.

18. A method for protecting a circuit component on a semiconductor substrate from a plasma etching or removal process, the method comprising:
forming a first layer over the circuit component to completely overlay and surround top and side surfaces of the circuit component;
forming a second layer over the first layer to cover at least an area of the first layer that completely overlays and surrounds the top and side surfaces of the circuit component;
transferring a pattern defined by a mask onto the second layer by selectively removing portions of the second layer in accordance with the pattern, the remaining portions of the second layer covering at least the area of the first layer that overlays the top and side surfaces of the circuit component; and
removing portions of the first layer that are not protected by the second layer, using a plasma gas selective to the first layer material, without removing the area of the first layer that completely overlays and surrounds the top and side surfaces of the circuit component, thereby protecting the circuit component from the plasma gas via the second layer and first layer.

19. The method of claim 18, wherein forming the first layer over the top and side surfaces of the circuit component includes forming the first layer to completely encapsulate the circuit component between the first layer and a third layer carrying the circuit component.

20. The method of claim 18, wherein forming the first layer over the top and side surfaces of the circuit component includes forming the first layer adjacent the side surfaces of the circuit component that extend substantially perpendicular to the top surface.

* * * * *

UNITED STATES PATENT AND TRADEMARK OFFICE
CERTIFICATE OF CORRECTION

PATENT NO. : 7,645,660 B2
APPLICATION NO. : 11/314194
DATED : January 12, 2010
INVENTOR(S) : Le Neel et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 636 days.

Signed and Sealed this

Twenty-eighth Day of December, 2010

David J. Kappos
*Director of the United States Patent and Trademark Office*